United States Patent
Delattre et al.

(10) Patent No.: US 7,919,391 B2
(45) Date of Patent: Apr. 5, 2011

(54) METHODS FOR PREPARING A BONDING SURFACE OF A SEMICONDUCTOR WAFER

(75) Inventors: Cécile Delattre, Grenoble (FR);
Frédéric Metral, St. Quentin sur Isere (FR); Daniel Delprat, Crolles (FR);
Christophe Maleville, La Terrasse (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 658 days.

(21) Appl. No.: 11/145,455

(22) Filed: Jun. 2, 2005

(65) Prior Publication Data
US 2006/0141746 A1 Jun. 29, 2006

(30) Foreign Application Priority Data

Dec. 24, 2004 (FR) ..................... 04 13922
Dec. 24, 2004 (FR) ..................... 04 13930

(51) Int. Cl.
*H01L 21/322* (2006.01)
*H01L 21/301* (2006.01)

(52) U.S. Cl. ........ 438/455; 438/458; 438/471; 438/473; 438/514; 438/526; 438/530; 257/E21.561; 257/E21.567; 257/E21.568; 257/E21.57

(58) Field of Classification Search .......... 438/455–459, 438/690, 471, 473–476, 480, 514, 515, 522, 438/526–528, 530, 558, 795, 799, 974; 257/E21.561, E21.567, E21.568, E21.57
See application file for complete search history.

(56) References Cited

U.S. PATENT DOCUMENTS

| 6,013,563 | A | * | 1/2000 | Henley et al. .............. 438/458 |
| 6,146,979 | A | * | 11/2000 | Henley et al. .............. 438/458 |
| 6,376,337 | B1 | | 4/2002 | Wang et al. ................. 438/478 |
| 6,376,377 | B1 | * | 4/2002 | Chang et al. ............... 438/689 |
| 6,495,388 | B1 | * | 12/2002 | Ismail ........................ 438/53 |
| 6,534,459 | B1 | * | 3/2003 | Yata et al. .................. 510/176 |

(Continued)

FOREIGN PATENT DOCUMENTS

EP 0 828 289 3/1998
(Continued)

OTHER PUBLICATIONS

Colinge, J. P., 1997, "Silicon-On-Insulator Technology", Materials to VLSI, 2nd Edition, pp. 50-51.

(Continued)

*Primary Examiner* — Matthew C Landau
*Assistant Examiner* — Maliheh Malek
(74) *Attorney, Agent, or Firm* — Winston & Strawn LLP

(57) ABSTRACT

The invention concerns a method of treating one or both bonding surfaces of first and second substrates and in particular, the surfaces of donor and receiver wafers that are intended to be bonded together. A simultaneous cleaning and activation step is carried out immediately prior to bonding the wafers together, by applying to one or both bonding surfaces an activation solution of ammonia ($NH_4OH$) in water, preferably deionized, at a concentration by weight in the range from about 0.05% to 2%. The method is applicable to fabricating structures used in the optics, electronics, or optoelectronics fields.

17 Claims, 3 Drawing Sheets

U.S. PATENT DOCUMENTS

| | | | |
|---|---|---|---|
| 6,596,610 B1 * | 7/2003 | Kuwabara et al. | 438/458 |
| 6,653,209 B1 * | 11/2003 | Yamagata | 438/459 |
| 6,969,668 B1 * | 11/2005 | Kang et al. | 438/458 |
| 7,232,759 B2 * | 6/2007 | Verhaverbeke | 438/690 |
| 2001/0014539 A1 | 8/2001 | Skrovan et al. | 438/692 |
| 2002/0102852 A1 | 8/2002 | Verhaverbeke et al. | 438/690 |
| 2003/0032292 A1 * | 2/2003 | Noguchi | 438/692 |
| 2003/0045098 A1 * | 3/2003 | Verhaverbeke et al. | 438/689 |
| 2003/0078173 A1 | 4/2003 | Wojtczak et al. | 510/175 |
| 2004/0006924 A1 * | 1/2004 | Scott et al. | 51/307 |
| 2004/0031979 A1 * | 2/2004 | Lochtefeld et al. | 257/233 |
| 2004/0126993 A1 | 7/2004 | Chan et al. | 438/455 |
| 2004/0229550 A1 * | 11/2004 | Mitchel et al. | 451/41 |
| 2004/0248379 A1 | 12/2004 | Maleville et al. | 438/458 |

FOREIGN PATENT DOCUMENTS

| | | |
|---|---|---|
| EP | 0 961 312 | 12/1999 |
| JP | 07 183288 | 7/1995 |

OTHER PUBLICATIONS

Agarwal, Aditya et al., 1998, "Efficient Production of Silicon-on Insulator Films by Co-implantation of He)+) with H(+)", Applied Physics Letters, 72:9, pp. 1086-1088.

Suni, T. et al., 2002, "Effects of Plasma Activation on Hydrophilic Bonding of Si and Si02", Journal of the Electrochemical Society, vol. 149, No. 6, pp. G348-G-351.

Preliminary French Search Report for FR0413922.

Preliminary French Search Report for FR0413930.

Y.-L. Chao et al., "Ammonium Hydroxide Effect on Low-Temperature Wafer Bonding Energy Enhancement", Electrochemical and Solid-State Letters, vol. 8, No. 3, pp. G74-G77 (2005).

TIPO's Search Report for Application No. 094145970.

C.Y. Chang et al., ULSI Technology, McGraw-Hill, Wafer Cleaning Technology, Chapter 2, pp. 74-78 (1996).

M. Quirk et al., "Semiconductor Manufacturing Technology", Prentice Hall, Chapter 6, pp. 140 (2001).

* cited by examiner

METHODS FOR PREPARING A BONDING SURFACE OF A SEMICONDUCTOR WAFER

BACKGROUND OF THE INVENTION

The present invention relates to the fields of microelectronics, optics, or optoelectronics, and, more particularly, to bonding semiconductor materials to produce structures for use in the fields of microelectronics, optics, or optoelectronics. Moreover, in certain respects, the invention relates to activating the bonding surface of at least one of two wafers to be bonded that may have been oxidized and/or undergone atomic species implantation.

In applications atomic species implantation can form a zone of weakness within a wafer, termed the "donor" wafer, at a predetermined depth. This method, known as "Smart-Cut" is known to those of ordinary skill in the art. Reference could be made, for example, to the work "Silicon-on-Insulator Technology, Materials to VLSI, $2^{nd}$ Edition, by Jean-Pierre Colinge, published by Kluwer Academic Publishers, pages 50 and 51). A structure known by the acronym SOI (silicon-on-insulator) can then be produced by implantation through the oxidized surface of a silicon donor wafer and by transferring, by bonding onto a silicon wafer termed the "receiver" wafer, a thin film including the superficial oxide layer and the upper thin layer of silicon derived from said donor wafer.

In today's semiconductor processing industry, the intensifying miniaturization of electronic components formed on such transferred thin films forces substrate fabricators to produce SOI type substrates with ever thinner upper layers of silicon, while seeking to retain excellent quality. As a result, improving the quality of transferred layers and thus improving techniques for taking off and transferring such layers is vital. Bonding quality is essential to good layer transfer, where the quality of that bonding is principally measured by the bonding energy binding the two wafers. As is explained below, it has now been established that the existence of certain contaminants on the wafer surfaces has the effect of reducing the bonding energy.

The implantation step generally brings hydrocarbon type contaminants to the wafer surface. In the presence of isolated particles or localized surface defects, that contamination can result in the formation of superficial blisters following detachment of the thin film and its transfer onto the receiver wafer, or even to the formation of non-transferred zones. Withdrawing such contaminants is thus vital in order to guarantee good quality and bonding contact.

In addition, the article by Aditya Agarwal, T. E. Haynes, V. C. Venezia, O. W. Holland and D. J. Eaglesham entitled "Efficient production of silicon-on-insulator films by co-implantation of $He^+$ with $H^+$", Applied Physics Letters, vol 72 (1998), pp 1086-1088 shows that while methods employing co-implantation of hydrogen and helium allows a much lower total implantation dose than that for simple implantation to be used, blister type defects are more numerous at the bonding interface.

Further, it has been shown that SOI type substrates with a buried oxide layer that is very thin, i.e. less than 50 nm (50 nanometers) thick, are more difficult to produce, since they are much more sensitive to the appearance of blister type defects. Thus, it is also important to reinforce the bonding energy in order to broaden the working conditions and the application possibilities of said "Smart-Cut" method. Finally, the bonding energy must also be reinforced to encourage proper detachment and layer transfer.

In fact, the existence of contaminants at the bonding interface can result in detachment of the layer at that interface rather than at the zone of weakness, thereby creating defects (non-transferred zones) on the receiver wafer, which correspond to residues on the donor wafer. The lower the bonding energy, the greater the quantity of non-transferred zones. Further, when the bonding energy is low, it is more difficult for the bonding wave to reach the edge of the wafer diametrically opposite to that from which bonding has been initiated, and a larger number of defects is observed in that region.

The prior art already discloses several methods of treating the surface prior to bonding, to improve bonding and to eliminate all particles present on the surface of the wafers to be bonded.

Such treatments generally comprise two successive steps, namely:
  a) a first step of cleaning and chemical activation; and
  b) a second step of cleaning, which second step is carried out immediately prior to bonding and is termed "clean-before-bond" below.

The purpose of cleaning the surfaces to be bonded in step a) is to:
  render said surfaces hydrophilic;
  withdraw contaminants, in particular of the hydrocarbon type, that have appeared on the surfaces of the wafers following implantation;
  remove isolated particles;
  limit the roughness (on an atomic scale) to ensure that wafers are brought into intimate contact.

The hydrophilic nature of the surface encourages bonding and can increase the bonding energy, limiting the appearance of defects at the wafer edge.

The prior art contains such a cleaning and activation method, termed "RCA", which consists in treating the surfaces to be bonded in succession with:
  a first solution known as "SC1" (standard clean 1) which comprises a mixture of ammonium hydroxide ($NH_4OH$), hydrogen peroxide ($H_2O_2$), and deionized water;
  a second solution known as "SC2" (standard clean 2), which comprises a mixture of hydrochloric acid (HCl), hydrogen peroxide ($H_2O_2$), and deionized water.

The first solution is principally intended to withdraw isolated particles present on the wafer surface and to render the surfaces hydrophilic, while the second solution is intended to remove metallic contamination. However, it has been shown that after carrying out such a treatment, the roughness of the wafer surfaces can sometimes be greater than that before the treatment, which considerably alters their bonding energy. Further, French patent application FR 04/0330 discloses a method of cleaning the oxidized surface of a wafer for bonding it to another wafer. Said method employs a mixture of ammonia solution ($NH_4OH$) and hydrogen peroxide ($H_2O_2$) and can remove isolated particles while avoiding creating surface roughness. Furthermore, it should be noted that while the above-mentioned Smart-Cut method comprises multiple cleaning steps, the clean-before-bond step b) is highly specific as it predetermines the quality of the substrates obtained after the step for transferring the layer(s). That step is aimed at withdrawing particles that have been deposited during the interval between the cleaning step a) and bonding. It is also aimed at reinforcing the hydrophilic nature of the wafers, as that tends to be reduced substantially as the time interval between the cleaning step a) and bonding is increased.

Cleaning is generally carried out by brushing the surfaces to be bonded with a solution of deionized water; see, for example, U.S. Patent Application 2004-0248379 published Dec. 9, 2004, entitled "Method for Bonding Semiconductor Structures Together" which is hereby expressly incorporated herein by reference.

With the above-mentioned two-step method, it unfortunately appears that the more the surface to be bonded is rendered hydrophilic in order to limit the number of transfer defects, the more the roughness of the surface increases, thus increasing the probability of the appearance of blister type defects.

In the above-mentioned RCA type treatment, a greater hydrophilic nature is obtained by using the SC 1 solution at a high temperature (>70° C.). However, in contrast, the treated surface will be etched, which will increase its roughness, and that increase in surface roughness increases with increasing temperature of the SC 1 bath.

Finally, an additional constraint also appears when using the above-mentioned method, as the time interval between the two steps must be minimized in order to preserve the hydrophilic nature of the treated wafers and to maximize the bonding energy. When carrying out the fabrication method on an industrial scale, this constraint results in additional constraints when managing batches of wafers to be treated.

OBJECTS AND SUMMARY OF THE INVENTION

As a result, the present invention aims to overcome the above-mentioned disadvantages and to introduce chemical activation of the surfaces during the clean-before-bond step, to simplify the prior cleaning step a) or even to dispense with it.

In one embodiment, a method of fabricating an optic, electronic, or optoelectronic structure is provided by surface bonding a first wafer to a second wafer. The method can include activating the first wafer surface prior to bonding by applying an activation solution comprising for example water and ammonia at a concentration of 0.05 to 2 percent by weight of the solution and in an amount sufficient to activate the surface to enhance bonding energy between the wafers. The second wafer surface can also be activated prior to bonding by applying an activation solution comprising for example water and ammonia at a concentration of 0.05 to 2 percent by weight of the solution in an amount sufficient to activate the surface to further enhance bonding energy between the wafers. The treatment can be applied immediately after bonding. At least one of the first and second wafer surfaces may be of the type that includes an oxide layer The concentration of ammonia in the activation solution can for example be 0.5 to 1.6 percent by weight of the solution and is, for example, applied to the wafer surface for a period of 10 seconds to 2 minutes. The activator solution can include chelating agents or surfactants in an amount sufficient to bind to and remove metals or undesirable ions in the activation solution that would otherwise remain on the wafer surface to interfere with the electrical characteristics of the structure or which would lead to the formation of blisters. The chelating agents or surfactants are preferably present, for example, in an amount of about 3 percent by weight of the solution, and the activating step is carried out, for example, at a temperature of 70° C. or less.

In some embodiments, the cleaning and activation step is carried out by simultaneously applying the activation solution while brushing the surface to be treated.

The first wafer can be a donor wafer that includes implanted atomic species that form a zone of weakness that defines, in the donor wafer and also includes a thin layer that is to be transferred. The thin layer is preferably detached from the first wafer after bonding to transfer the thin layer to the second wafer. A consolidating anneal step can be conducted between the bonding step and the detachment step to aid the process. The donor wafer is preferably made of a semiconductor material (e.g., stressed silicon).

In some embodiments, the activation solution is applied in a manner to avoid increasing roughness of the surface of the wafer so that transfer defects at the edge of the wafer are reduced or minimized.

The activation solution of ammonia ($NH_4OH$) preferably has a concentration by weight in water in the range that is close to 0.8%. The activation solution can comprise about 97% of said solution of ammonia and 3% of chelating agents or surfactants.

As illustratively described above, the principles of the present invention relates to methods of treating one or the other or both surfaces, termed "bonding" surfaces of a first wafer termed the "donor" wafer and a second wafer termed the "receiver" wafer intended to be bonded against the other with the aim of fabricating a structure used in the optics, electronics, or opto-electronics fields. In accordance with the invention, such methods preferably include a cleaning and activation step carried out immediately prior to bonding said donor and receiver wafers, by applying to said bonding surface(s) a solution termed the "activation solution" comprising a solution of ammonia ($NH_4OH$) in water, preferably deionized, in a concentration by weight in the range from about 0.05% to 2%. In one implementation, the solution of ammonia ($NH_4OH$) has a concentration by weight in water in the range from about 0.5% to 1.6%, preferably close to 0.8%. In a second implementation, the activation solution comprises about 97% of said solution of ammonia and about 3% of chelating agents and/or surfactants. In some embodiments, if the prior cleaning step a) is retained before bonding, the invention also aims to allow the storage time for wafers between that cleaning step a) and the clean-before-bond step of the invention to be increased, while keeping the bonding energy high following bonding of the two wafers.

The activation step of the invention can be smoothly integrated into the existing industrial method of fabricating SOI substrates.

In some embodiments, the activation solution is applied directly onto the bonding machine. The activation solution can for example be applied for a period in the range 10 seconds to 2 minutes. If desired, said cleaning and activation step is carried out by simultaneously applying said activation solution and brushing the bonding surface to be treated.

In implementation, to form an SOI structure, at least one of the two bonding surfaces is covered with a layer of oxide. In addition, the donor wafer has undergone atomic species implantation prior to bonding to form a zone of weakness defining a thin layer to be transferred.

In sequence, the method of forming an SOI structure can comprise implanting atomic species into a wafer termed the "donor" wafer having an oxide layer on its surface, to form therein a zone of weakness defining a thin layer; cleaning and activating the oxidized surface of said donor wafer immediately prior to bonding, in accordance with methods described herein; bonding said activated surface of the donor wafer onto the surface of another wafer termed the "receiver" wafer, optionally oxidized, said surface optionally having been cleaned and activated in accordance with methods described herein; and detaching said thin layer and said oxide layer at said zone of weakness in order to take them off and transfer them onto said receiver wafer. A consolidating anneal step can be implemented between the bonding step and the detachment step.

Other advantageous, non-limiting characteristics of the invention, taken alone or in combination, are as follows:

the cleaning and activation step is carried out by applying said activation solution at a temperature of 70° C. or less;

the activation solution is applied directly onto the bonding machine, preferably for a period in the range 10 seconds to 2 minutes;

said cleaning and activation step is carried out by simultaneously applying said activation solution and brushing the bonding surface to be treated;

at least one of the two bonding surfaces is covered with a layer of oxide;

the donor wafer has undergone atomic species implantation prior to bonding to form a zone of weakness defining a thin layer to be transferred.

Other characteristics of the invention, taken alone or in combination, are as follows:

said method comprises a consolidating anneal step between the bonding step and the detachment step; and the donor wafer is produced from a semiconductor material, from silicon or from stressed silicon.

This method allows a semiconductor-on-insulator type structure or a silicon-on-insulator (SOI) type structure to be fabricated.

BRIEF DESCRIPTION OF THE DRAWINGS

Other characteristics and advantages of the invention will become apparent from the following description made with reference to the drawings which show a possible, non-limiting implementation by way of indication.

DETAILED DESCRIPTION

A principal aim of the present invention is to reduce the number of defects and the surface roughness of at least one of two wafers intended to be bonded to the other, in order to increase the bonding energy between the wafers.

More particularly, the invention is applicable to wafers coated with a layer of oxide, said oxide being either "native", i.e. resulting from oxidation of the wafer in the open air, or additional and resulting from heat treating said wafer or from deposition of a layer of oxide, for example.

The invention is of particular application when fabricating an SOI type substrate. The various steps in this method are recalled below.

Figure 1A:
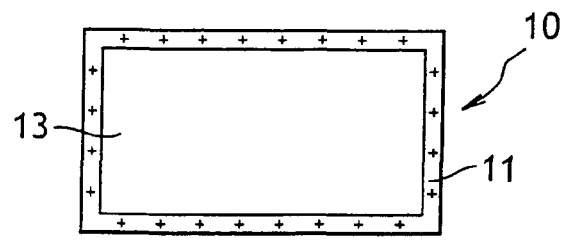
FIGS. 1a to 1d show the principal steps in a method of taking off and transferring layers applied to the production of a SOI type substrate.
Figure 1B:
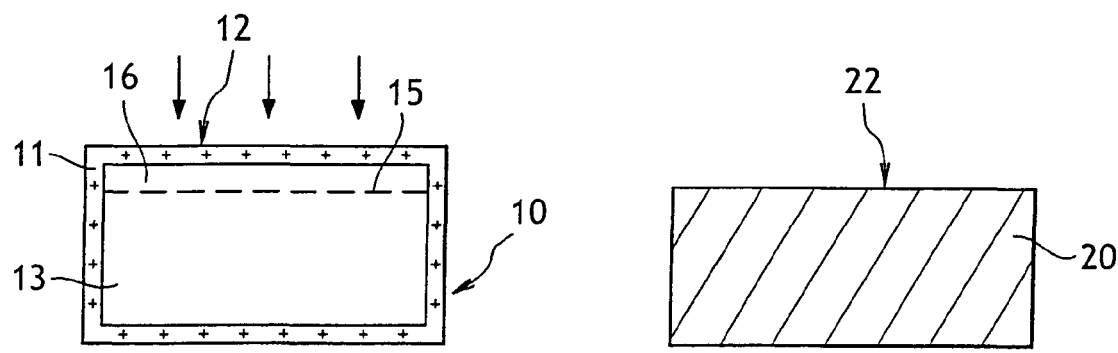

With reference to FIG. 1a, in forming an SOI structure, a first step can include oxidizing a wafer formed from semiconductor material 13 to form a donor wafer 10 with a layer of oxide 11 on the surface. In general, said oxidation results from heat treatment or deposition of a layer of oxide, for example a layer of $SiO_2$ when the wafer 13 is formed from silicon. Referring now to FIG. 1b, the donor wafer 10 undergoes, through one of its oxidized surfaces, implantation of atomic species, such as hydrogen and/or helium, for example. The energy and doses for said implantation are selected so as to form a zone of weakness 15 at a predetermined depth beneath the surface of the donor wafer 10, more precisely inside the wafer 13. A thin layer 16 is thus formed, defined on one side by the zone of weakness 15 and on the other side by the layer of oxide 11. The oxidized surface of the donor wafer 10 which has undergone implantation carries reference numeral 12. This surface 12 and/or the surface 22 of a wafer 20, the "receiver", then undergo a clean-before-bond treatment which is discussed in detail below.

Figure 1C:
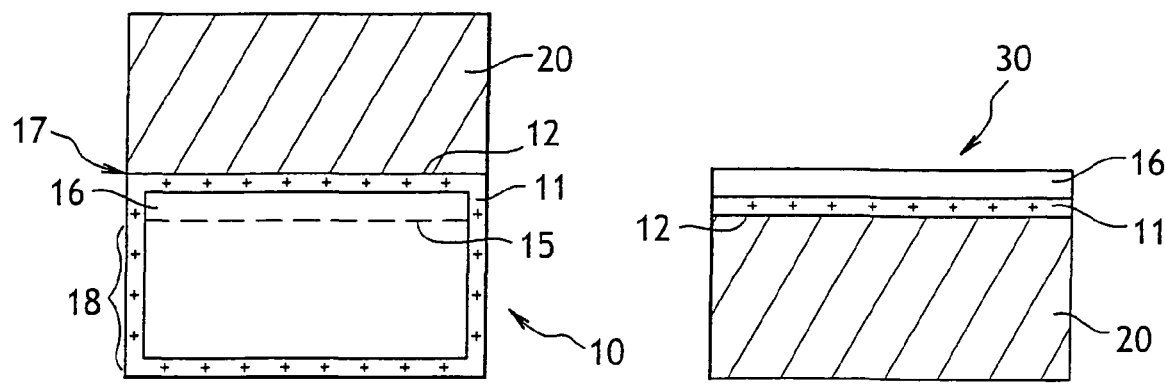
Figure 1D:
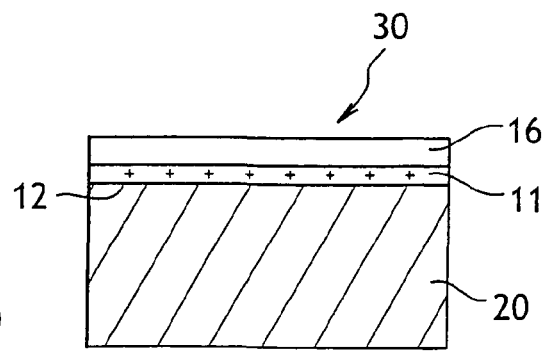

Referring now to FIG. 1c, the surfaces 12 and 22 are then brought into contact and bonded by molecular bonding. At this stage, an annealing step is optionally carried out to reinforce the bonding interface 17 between the donor wafer 10 and the receiver wafer 20. Finally, referring now to FIG. 1d, energy of thermal, mechanical, and/or chemical origin is supplied, which energy is sufficient for detachment along the zone of weakness 15 to detach the thin layer 16 from the remainder 18 of the donor wafer. The semiconductor-on-insulator structure shown in FIG. 1d is thus obtained; the thin layer 16 taken off the donor wafer 10 forms the semiconductor portion and the subjacent oxide layer 11 forms the electrically insulating portion. This structure has reference numeral 30.

A finishing step using chemical-mechanical polishing, for example, is then optionally carried out to eliminate any defects or roughness appearing during detachment of the thin layer 16. The final structure 30 obtained is intended for applications in the fields of microelectronics, optics or optoelectronics.

Although not shown in the figures, the receiver wafer 20 could optionally be covered with a layer of oxide, in particular native oxide.

In one aspect, the aim of the invention is to provide a method of cleaning the surfaces to be bonded prior to bonding, e.g., in the above-mentioned example, the surfaces 12 and/or 22. This method not only eliminates contaminants or isolated particles, but also activates the surfaces to be bonded.

When the two wafers are then brought into contact, their adhesion is reinforced when the respective bonding surfaces (or at least one of them) have been activated. Said adhesion is facilitated by the hydrophilic nature of the surfaces to be bonded and corresponds most of the time to a molecular interaction between the hydrogen atoms present on the surface of the wafers to be bonded.

Reference can be made, for example, to the article by R. Stengl et al, "A model for the silicon wafer bonding method", Japanese Journal of Applied Physics, vol 28, no 10, October 1989, pp 1735-1741 for the description of surface activation phenomena and hydrophilic bonding.

In accordance with the invention, it has been observed that the treatment of the bonding surfaces of the two wafers to be bonded, or of at least one of said surfaces using an "activation" solution, can increase the bonding energy between said two wafers.

In accordance with a first implementation of the invention, said activation solution is a solution of ammonia ($NH_4OH$) in water, preferably deionized, in a concentration by weight in the range from about 0.05% to 2%. Preferably, said concentration by weight is in the range 0.5% to 1.6%, more preferably close to 0.8%. Said solution of ammonia is a pure solution, i.e. a solution wherein the concentration of metallic contaminant type pollutants (copper, iron, chromium, titanium, nickel, aluminum) and/or alkaline contaminants (lithium, sodium, calcium, potassium, etc) does not exceed a concentration of 10 ppt (parts per trillion) for each element.

In accordance with a second implementation of the invention, it is possible to use an activation solution comprising about 97% of the above-mentioned solution of ammonia and about 3% of chelating agents and/or surfactants. Said chelating agents act to bind contaminants such as metals or ions in solution, which contaminants are often present in industrial ammonia and which would risk remaining trapped on the bonding interface, thereby modifying the electrical characteristics of the final substrate obtained. The surfactant can increase the efficiency of removal of particles which are likely to lead to the formation of superficial blisters.

Advantageously, because it is simpler to carry out industrially, the above-mentioned solution of ammonia is used at ambient temperature. However, it may be applied at higher temperatures, preferably not exceeding 70° C. At higher temperatures, surface roughness increases substantially, leading to an increase in the number of blister type defects.

The above-mentioned activation treatment is carried out immediately prior to bonding, preferably directly on the bonding machine, to reactivate the hydrophilic nature of the wafers in contact even if there has been a time interval of several hours following the cleaning step, as will be detailed below.

The activation solution can be distributed either directly onto the wafers to be treated without brushing, or directly onto the brushes used for activation, or onto the wafers, before subsequent brushing.

This brushing technique has been described, for example, in above-mentioned U.S. Patent Application 2004-0248379.

The solution of ammonia is preferably delivered for a period of 10 seconds to 2 minutes, more preferably 30 seconds to 1 minute, at a rate of the order of 1.5 l/min (liters/minute), directly into the bonding equipment, for example using a distributor arm.

In a variation, the solution of ammonia can be distributed from specific cleaning equipment, for example by spraying ("single wafer" type equipment) or using a bath ("wet bench" type equipment).

A comparative study of the bonding energy at the interface between two wafers has been conducted, using series of wafers which have respectively undergone a "control" activation method or the activation method in accordance with the present invention.

The study used an accurate technique for measuring the bonding energy as proposed by Maszara in the document entitled "Silicon on insulator by wafer bonding" (J Electrochem Soc, volume 138, page 341 (1991)).

Figure 2:
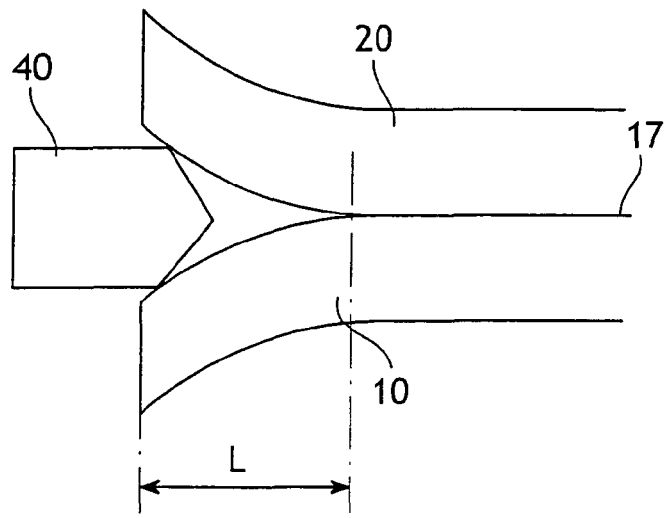
FIG. 2 is a diagram showing a technique for measuring the bonding energy between two wafers.

In accordance with that technique, shown schematically in FIG. 2, the blade 40 was inserted into one or more edges of the assembly of wafers 10 and 20 in contact with each other, at the bonding interface 17.

Application of a mechanical force via the blade 40 in a direction parallel to the plate of the interface 17 caused local unbonding of the two wafers 10 and 20 and propagation of the unbonded zone over a certain distance.

The length L between the outer edge of the wafers 10, 20 and the point at which unbonding stops, which corresponds to the sum of the length of the zone locally unbonded by the blade 40 and that of the propagation of the unbonded zone, gives an indication of the bonding energy existing between the two wafers 10 and 20. Termination of unbonding corresponds to equilibrium between the bonding energy and the elastic deformation characterizing unbonding. A mean bonding energy τ can then be calculated from a relationship between the length of the unbonded zone L and the surface energy. Reference can be made, for example, to the following formula taken from Maszara's document:

$$\tau = \frac{3 \cdot E \cdot t^3 \cdot y^2}{32 \cdot L^4}$$

in which
    E is the Young's modulus of the material present at the interface between the two wafers 10 and 20;
    y is the half-thickness of the blade;
    t is the thickness of each wafer.

Said comparative study was carried out using several batches of structures comprising two wafers of eight inch (200 mm) silicon one of which had been oxidized and had undergone a hydrogen ion implantation step, said two wafers being assembled by molecular bonding. The results obtained are shown in the graph in FIG. 3. The bonding energy between the two wafers was measured using the method described above.

Figure 3:
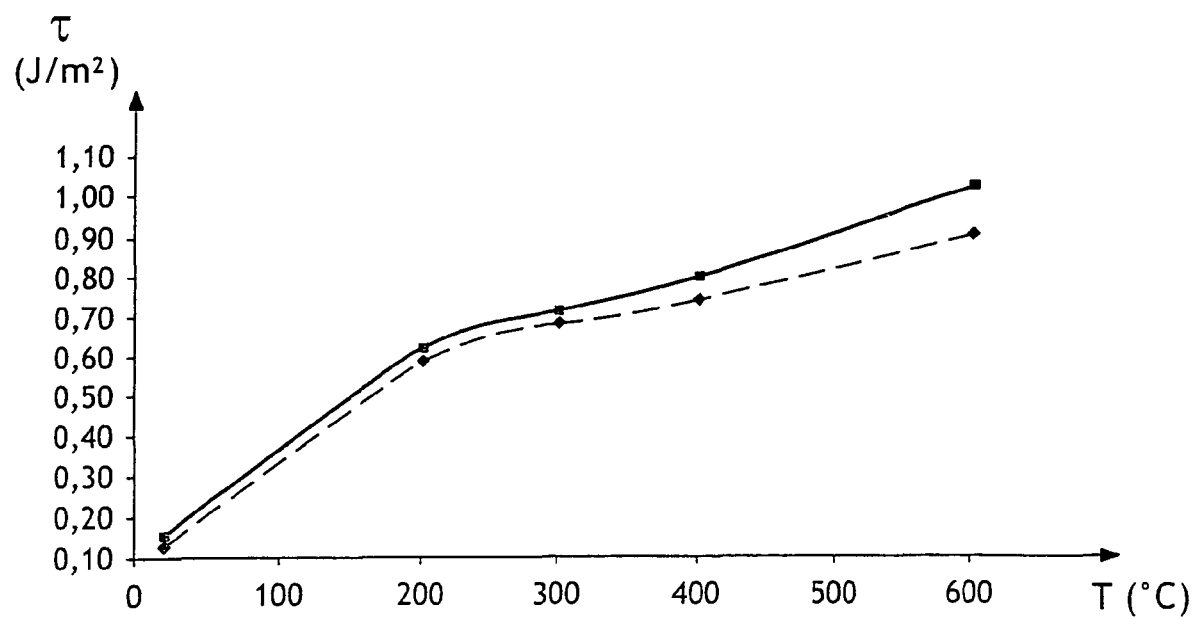
FIG. 3 is a graph showing the bonding energy between two wafers as a function of the temperature of the anneal treatment, for series of wafers that have respectively undergone either a "control" cleaning and activation method or the clean-before-bond method in accordance with one embodiment of the invention.

FIG. 3 shows the bonding energy τ as a function of the temperature of an optional anneal treatment (termed "consolidation treatment"), carried out for 2 hours. Some of the structures did not undergo a subsequent consolidation treatment (results obtained when the temperature was close to 20° C.), and others underwent said treatment for 2 hours, at various temperatures.

The curve drawn as a dotted line shows the results obtained with batches, in which the bonding surfaces of the wafers had undergone a cleaning treatment immediately prior to bonding, carried out by simple brushing in water. That treatment is termed "control" cleaning below. The curve drawn as a solid line shows the results obtained with batches, in which the bonding surfaces of the wafers had undergone a cleaning and activation treatment in accordance with the invention.

That treatment, carried out immediately prior to bonding, consisted of applying a solution of ammonia ($NH_4OH$) in deionized water in a concentration by weight of 0.5%, at ambient temperature, said solution being distributed onto brushes when brushing the wafers.

These results show that independent of the temperature at which the consolidation treatment is carried out, the bonding energy value obtained is higher with the activation method of the invention, said increase being greater when the consolidation treatment is over 300° C.

Figure 4:
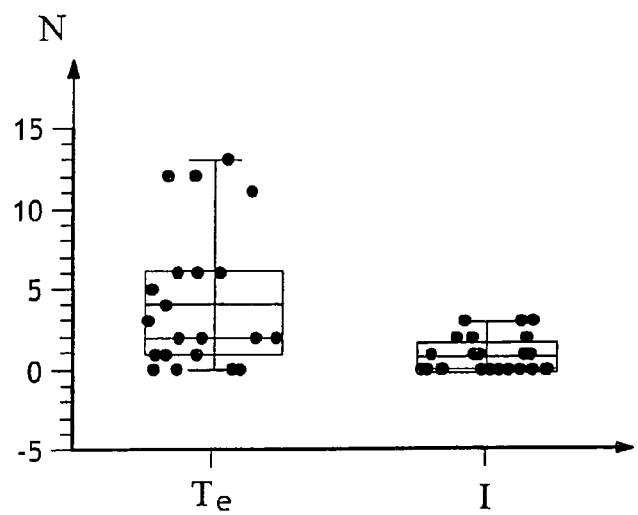
FIG. 4 is a graph showing the results of measuring the number of transfer defects in a transferred layer, from series of wafers that have respectively undergone either a "control" cleaning and activation method or the clean-before-bond method in accordance with one embodiment of the invention of the invention.

A second comparative study was carried out to measure the number of transfer defects appearing in the thin film 16 and the oxide layer 11, after detachment along the zone of weakness. Batches of wafers similar to those described for the above test were used. FIG. 4 shows the results of this study. The ordinate axis shows the number of transfer defects N measured per wafer.

The abscissa shows the results obtained, firstly with the control batches Te in which the activation step was carried out using the above-mentioned "control" method, and secondly with batches I, in which the activation step was carried out in accordance with the invention, as above described in association with FIG. 3. The mean number of transfer defects N in the first case was 4.09, while it was close to 0.83 in the second case. A thin layer transferred onto a receiver wafer, after the bonding surfaces of the donor and receiver wafers have undergone the activation treatment of the invention, thus has on average nearly five times fewer transfer defects than a thin layer obtained after "control" treatment.

Figure 5:
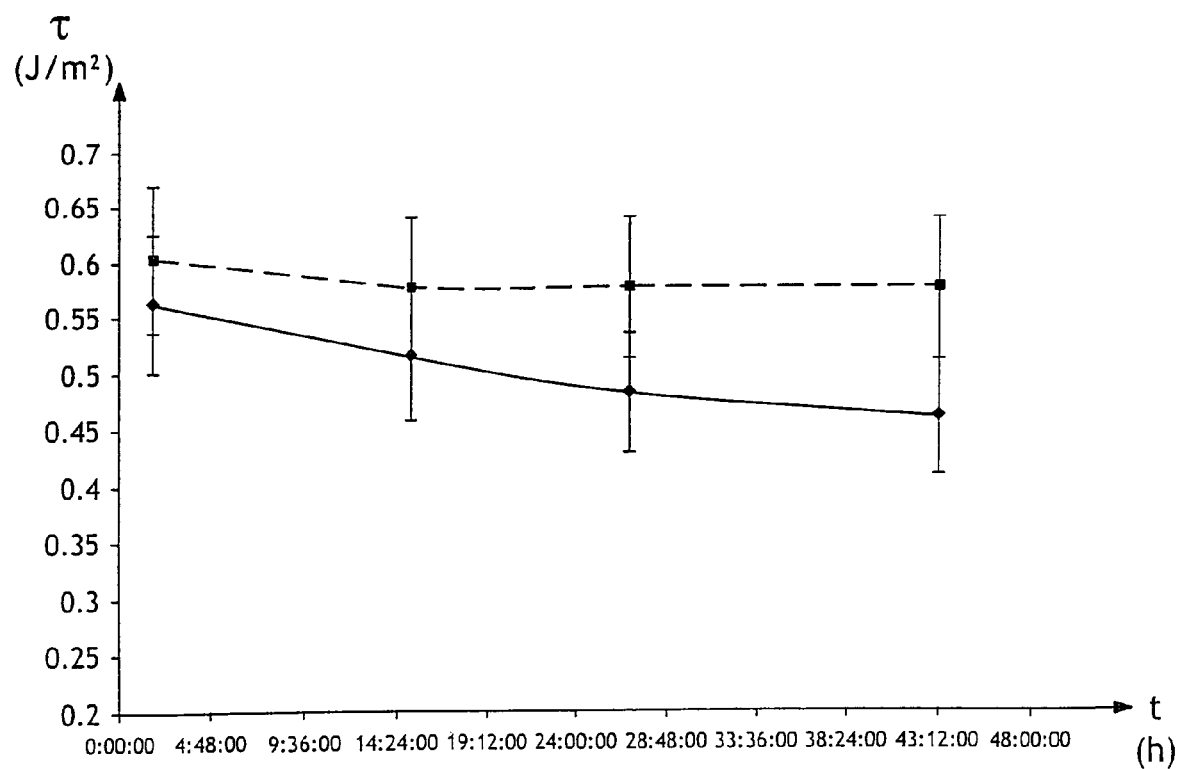
FIG. 5 shows the change in the bonding energy between two wafers for batches of wafers that have undergone a first cleaning treatment, then a cleaning treatment immediately prior to bonding but not at the same time as the first clean, said second clean being either a "control" clean or one in accordance with one embodiment of the present invention.

Finally, as shown in FIG. 5, a third series of comparative tests was carried out to measure the value of the bonding energy τ between a donor wafer, oxidized and implanted, and a receiver wafer, as a function of the time interval t between a first cleaning step for the surfaces to be bonded and bonding proper, said wafers also having undergone an activation step immediately prior to bonding. The two wafers were formed from silicon and measured eight inches in diameter (200 mm). The first cleaning treatment was of the above-mentioned RCA type. The activation treatment of the invention was carried out by brushing, in a dilute ammonia solution, at a concentration by weight of below 0.5% in deionized water. The curve drawn in FIG. 5 as a solid line shows the results obtained with wafers which had undergone the "control" activation treatment described in respect to FIGS. 3 and 4.

The curve shown as a dotted line in FIG. 5 shows the results obtained with wafers which have undergone an activation treatment in accordance with the invention.

These results show that not only the bonding energy τ is increased when using the activation treatment of the invention, as shown in FIG. 3, but also that the bonding energy is reduced only very slightly from a time interval of 0 to 14 hours between the first clean and final bonding, and that it then stabilizes with time, as shown in FIG. 5.

The Applicant has demonstrated the importance of implementing the activation method of the invention in a method of taking off and transferring a layer, and more precisely in fabricating an SOI type substrate.

The method of the invention can increase the bonding energy, which means that the criteria for carrying out a first clean carried out a certain period before bonding can be less stringent, or it may even be completely dispensed with.

This can simplify and homogenize the surface preparation steps carried out in a production line prior to bonding proper.

Further, the activation method of the invention can reduce the number of transfer defects at the edge of the wafer to less than one per plate on average, which considerably enhances the quality of the thin layer in which future electronic components will be produced.

The present invention is not limited to an activation method of bonding two silicon wafers at least one of which is covered with a silicon oxide layer, but can be extended to any type of material such as stressed silicon or another semiconductor material which can be used with Smart-Cut technology.

It should be understood that the above description of the invention and specific examples, while indicating preferred embodiments of the present invention, are given by way of illustration and not limitation. Many changes and modifications within the scope of the present invention may be made without departing from the spirit thereof, and the present invention includes all such changes and modifications.

What is claimed is:

1. A method of enhancing bonding energy between a first wafer surface and a second wafer surface, while reducing or minimizing transfer defects, to facilitate transfer of a layer from the first wafer to the second wafer, which comprises:
    providing the first wafer as a donor wafer, wherein the donor wafer includes an implanted species that forms a zone of weakness at a predetermined depth beneath a surface of the donor wafer to be bonded that defines a layer to be transferred;
    providing the second wafer as a receiving wafer;
    providing one or both of the first and second wafers with a silicon oxide layer, wherein the first wafer and second wafer or their silicon oxide layer(s) present a bonding surface for bonding the wafers together;
    cleaning one or both bonding surfaces before applying the activation solution;
    applying an activating solution to one or both bonding surfaces immediately prior to bonding for a period of 10 seconds to 2 minutes for activating the bonding surface(s), wherein the activating solution comprises ammonia in water (NH4OH) in a concentration by weight in the range from about 0.05% to 0.8% without any hydrogen peroxide ($H_2O_2$) while brushing the bonding surface(s) to be activated in order to enhance bonding energy between the wafers;
    bonding the donor and receiving wafers together at the bonding surfaces by contacting the at least one activated bonding surface and the other bonding surface; and
    detaching the layer at the weakened zone to transfer it to the receiving wafer.

2. The method of claim 1, wherein the activation solution is a pure solution of ammonia in water which comprises 97% of the activating solution.

3. The method of claim 1, wherein the cleaning of the bonding surface(s) comprises an RCA treatment.

4. The method of claim 1, wherein the activating solution is applied out at a temperature of 70° C. or less.

5. The method of claim 1, wherein the activating solution includes chelating agents or surfactants in an amount sufficient to bind to and remove metals or undesirable ions that would otherwise remain on the bonding surface to interfere with the electrical characteristics of the structure or which would lead to the formation of blisters.

6. The method of claim 5, wherein the chelating agents or surfactants are present in the activating solution in an amount of about 3%.

7. The method of claim 1, wherein the bonding surface that is to receive the activating solution is a surface on the transfer layer of the donor wafer.

8. The method of claim 1, wherein the bonding surface that is to receive the activating solution is a surface on the receiver substrate.

9. The method of claim 1, which further comprises applying the activating solution to each bonding surface prior to bonding.

10. The method of claim 1, which further comprises cleaning both bonding surfaces before applying the activating solution.

11. The method of claim 1, wherein at least one of the bonding surfaces includes an oxide layer.

12. The method of claim 1, wherein both bonding surfaces include an oxide layer.

13. The method of claim 1, wherein the weakened zone of the donor wafer includes implanted atomic species.

14. The method of claim 1, which further comprises conducting a consolidating annealing step between the bonding step and the detaching step.

15. The method of claim 1, wherein the donor wafer is made of a semiconductor material.

16. The method of claim 15, wherein the donor wafer is made of stressed silicon.

17. The method of claim 16, wherein the donor substrate has an implanted bonding surface.

* * * * *